United States Patent
Ramaswamy et al.

(10) Patent No.: US 8,035,129 B2
(45) Date of Patent: *Oct. 11, 2011

(54) INTEGRATED CIRCUITRY

(75) Inventors: Nirmal Ramaswamy, Boise, ID (US);
Gurtej S. Sandhu, Boise, ID (US); Cem Basceri, Reston, VA (US); Eric R. Blomiley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/820,924

(22) Filed: Jun. 22, 2010

(65) Prior Publication Data
US 2010/0258857 A1    Oct. 14, 2010

Related U.S. Application Data

(60) Division of application No. 12/410,179, filed on Mar. 24, 2009, now Pat. No. 7,768,036, which is a division of application No. 11/418,582, filed on May 4, 2006, now Pat. No. 7,528,424, which is a continuation of application No. 10/932,129, filed on Sep. 1, 2004, now Pat. No. 7,132,355.

(51) Int. Cl.
*H01L 31/072* (2006.01)
*H01L 31/109* (2006.01)
*H01L 31/0328* (2006.01)
*H01L 31/0336* (2006.01)

(52) U.S. Cl. .......... 257/192; 257/77; 257/519; 438/607; 438/667

(58) Field of Classification Search .............. 257/77, 257/183, 192, 519, 616; 438/607, 646, 663, 438/681, 687
See application file for complete search history.

(56) References Cited

U.S. PATENT DOCUMENTS

| | | |
|---|---|---|
| 4,526,631 A | 7/1985 | Silvestri et al. |
| 4,528,047 A | 7/1985 | Beyer et al. |
| 4,758,531 A | 7/1988 | Beyer et al. |
| 4,816,098 A | 3/1989 | Davis et al. |
| 4,847,210 A | 7/1989 | Hwang et al. |
| 5,039,625 A | 8/1991 | Reisman et al. |
| 5,073,516 A | 12/1991 | Moslehi |
| 5,198,071 A | 3/1993 | Scudder et al. |
| 5,248,385 A | 9/1993 | Powell |
| 5,250,837 A | 10/1993 | Sparks |
| 5,294,286 A | 3/1994 | Nishizawa et al. |
| 5,340,754 A | 8/1994 | Witek et al. |
| 5,460,994 A | 10/1995 | Kim |

(Continued)

OTHER PUBLICATIONS

Bashir et al., "Characterization and modeling of sidewall defects in selective epitaxial growth of silicon", J. Vac. Sci. Technol. B 13(3), pp. 928-935 (May/Jun. 1995).

*Primary Examiner* — Phuc T Dang
(74) *Attorney, Agent, or Firm* — Wells St. John P.S.

(57) ABSTRACT

This invention includes methods of forming layers comprising epitaxial silicon, and field effect transistors. In one implementation, a method of forming a layer comprising epitaxial silicon comprises epitaxially growing a silicon-comprising layer from an exposed monocrystalline material. The epitaxially grown silicon comprises at least one of carbon, germanium, and oxygen present at a total concentration of no greater than 1 atomic percent. In one implementation, the layer comprises a silicon germanium alloy comprising at least 1 atomic percent germanium, and further comprises at least one of carbon and oxygen at a total concentration of no greater than 1 atomic percent. Other aspects and implementations are contemplated.

21 Claims, 2 Drawing Sheets

U.S. PATENT DOCUMENTS

| | | |
|---|---|---|
| 5,599,724 A | 2/1997 | Yoshida |
| 5,707,885 A | 1/1998 | Lim |
| 5,753,542 A * | 5/1998 | Yamazaki et al. ............ 438/162 |
| 5,753,555 A | 5/1998 | Hada |
| 5,763,305 A | 6/1998 | Chao |
| 5,786,229 A | 7/1998 | Park |
| 5,795,809 A * | 8/1998 | Gardner et al. ............... 438/402 |
| 5,866,930 A * | 2/1999 | Saida et al. ................... 257/316 |
| 6,060,746 A | 5/2000 | Bertin et al. |
| 6,064,081 A | 5/2000 | Robinson et al. |
| 6,156,620 A | 12/2000 | Puchner et al. |
| 6,204,532 B1 | 3/2001 | Gambino et al. |
| 6,297,531 B2 | 10/2001 | Annacost et al. |
| 6,406,962 B1 | 6/2002 | Agnello et al. |
| 6,436,770 B1 | 8/2002 | Leung et al. |
| 6,437,375 B1 | 8/2002 | Beaman |
| 6,448,129 B1 | 9/2002 | Cho et al. |
| 6,492,216 B1 | 12/2002 | Yeo et al. |
| 6,506,638 B1 | 1/2003 | Yu |
| 6,518,609 B1 | 2/2003 | Ramesh |
| 6,605,498 B1 * | 8/2003 | Murthy et al. ............... 438/197 |
| 6,617,226 B1 | 9/2003 | Suguro et al. |
| 6,624,032 B2 | 9/2003 | Alavi et al. |
| 6,632,712 B1 | 10/2003 | Ang et al. |
| 6,642,539 B2 | 11/2003 | Ramesh et al. |
| 6,660,590 B2 | 12/2003 | Yoo |
| 6,670,689 B2 | 12/2003 | Oh et al. |
| 6,703,290 B2 | 3/2004 | Boydston et al. |
| 6,713,378 B2 | 3/2004 | Drynan |
| 6,716,687 B2 | 4/2004 | Wang et al. |
| 6,716,719 B2 | 4/2004 | Clampitt et al. |
| 6,734,082 B2 | 5/2004 | Zheng et al. |
| 6,746,923 B2 | 6/2004 | Skotnicki et al. |
| 6,777,744 B2 | 8/2004 | Noble |
| 6,790,713 B1 | 9/2004 | Horch |
| 7,132,355 B2 * | 11/2006 | Ramaswamy et al. ........ 438/607 |
| 7,262,089 B2 | 8/2007 | Abbott et al. |
| 7,453,103 B2 | 11/2008 | Abbott et al. |
| 7,501,760 B2 | 3/2009 | Ramaswamy et al. |
| 7,528,424 B2 | 5/2009 | Ramaswamy et al. |
| 2001/0010962 A1 | 8/2001 | Chen et al. |
| 2001/0017392 A1 | 8/2001 | Comfort et al. |
| 2001/0041438 A1 | 11/2001 | Maeda et al. |
| 2002/0070430 A1 | 6/2002 | Oh et al. |
| 2002/0081861 A1 | 6/2002 | Robinson et al. |
| 2003/0027406 A1 | 2/2003 | Malone |
| 2003/0141278 A1 | 7/2003 | Chang et al. |
| 2003/0194496 A1 | 10/2003 | Xu et al. |
| 2003/0234414 A1 | 12/2003 | Brown |
| 2005/0079691 A1 | 4/2005 | Kim et al. |
| 2006/0046440 A1 | 3/2006 | Ramaswamy |
| 2006/0051941 A1 | 3/2006 | Blomiley et al. |
| 2006/0264010 A1 | 11/2006 | Ramaswamy et al. |

* cited by examiner

INTEGRATED CIRCUITRY

RELATED PATENT DATA

This patent resulted from a divisional of U.S. patent application Ser. No. 12/410,179, filed Mar. 24, 2009, entitled "Integrated Circuitry", naming D. V. Nirmal Ramaswamy, Gurtej S. Sandhu, Cem Basceri and Eric R. Blomiley as inventors, now U.S. Pat. No. 7,768,036, which was a divisional application of U.S. patent application Ser. No. 11/418,582, filed May 4, 2006, entitled "Integrated Circuitry", naming D. V. Nirmal Ramaswamy, Gurtej S. Sandhu, Cem Basceri and Eric R. Blomiley as inventors, now U.S. Pat. No. 7,528,424, which was a continuation application of U.S. patent application Ser. No. 10/932,129, filed Sep. 1, 2004, entitled "Method of Forming a Layer Comprising Epitaxial Silicon and a Field Effect Transistor", naming D. V. Nirmal Ramaswamy, Gurtej S. Sandhu, Cem Basceri and Eric R. Blomiley as inventors, and which is now U.S. Pat. No. 7,132,355, the disclosures of which are incorporated by reference.

TECHNICAL FIELD

This invention relates to methods of forming layers comprising epitaxial silicon, and to field effect transistors.

BACKGROUND OF THE INVENTION

Silicon is a common semiconductive material used in the fabrication of integrated circuits. Silicon can occur in crystalline and amorphous forms, and when crystalline can be monocrystalline or polycrystalline. In some instances, silicon is combined with germanium, essentially forming a silicon germanium alloy. Such materials can be doped with conductivity enhancing impurities (i.e., boron and/or phosphorus) to modify the conducting characteristics of the silicon-comprising material.

Monocrystalline silicon can be provided in bulk substrate form or otherwise grown or deposited epitaxially from an exposed monocrystalline material. Epitaxy generally involves the growth or deposition of a single or monocrystalline layer of material such that the epitaxial layer has a crystal orientation which is common to that of the material from which it is grown. One factor that determines the quality of the epitaxial silicon-comprising layer relates to the presence and quantity of crystallographic defects. Such are non-uniformities in the crystal structure of the epitaxial layer. Many of these defects are caused by defects appearing at the surface of the substrate which propagate into the layer during growth. Examples include sidewall dislocations and stacking faults. Dislocations and stacking faults can be electrically active more so than the surrounding material within the epitaxial layer due to the presence of dangling bonds. Such can lead to unnecessary recombination generation currents, lower breakdown voltages, higher current leakage and larger junction ideality factors.

One place where epitaxial silicon has been utilized is as one or more of the components in a field effect transistor. Transistor structures comprise a channel region received between a pair of source/drain regions, and a gate configured to electrically connect the source/drain regions to one another through the channel region. The transistor constructions utilized in semiconductor constructions are supported by a semiconductor substrate. The semiconductor substrate will have a primary surface which can be considered to define a horizontal direction. Transistor devices can be divided into two broad categories based upon the orientations of the channel regions relative to the primary surface of the semiconductor substrate. Specifically, transistor structures which have channel regions that are primarily parallel to the primary surface of the substrate are referred to as planar or horizontal transistor structures, and those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions of the devices is primarily substantially orthogonal to a primary surface of a semiconductor substrate, and planar or horizontal transistor devices are devices in which the current flow between source and drain regions is primarily parallel to the primary surface of the semiconductor substrate.

Epitaxial silicon-comprising materials have been proposed for use in channel regions of vertical transistors. Further, one or both of the source/drain areas of a vertical transistor might also comprise epitaxially grown silicon or an epitaxially grown silicon germanium alloy. Requirements for epitaxial materials within a vertically oriented channel region are typically more stringent than for the use of such material in source/drain regions of horizontally oriented field effect transistors. Further, fabrication of vertical field effect transistors typically utilizes masks of oxide, nitride or other materials for self-aligned patterning of the epitaxial silicon-comprising material during its formation. The interface of the epi with these materials can be a defect source. Further, the selective epitaxial growth of silicon for vertical transistors typically utilizes lower deposition temperatures as compared to blanket epitaxial silicon depositions. Unfortunately, the use of lower temperatures reduces surface mobility and can also result in increased defects over that of higher temperature processing. Also and regardless, thermal stress can be generated during cool-down of the substrate from the temperature at which the epitaxial silicon-comprising material was grown. This can result in crystallographic defects being generated after growth.

Further, where the epitaxial silicon-comprising material includes germanium, such has an increased tendency for defect formation on the surface during deposition due to mismatched lattice constants of silicon and germanium. These defects propagate and either terminate with other defects or at the surface. Regardless, after deposition, crystallographic defects are extremely difficult to remove or heal within the bulk epitaxially grown material or at interfaces of such material with other materials.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

This invention includes methods of forming layers comprising epitaxial silicon, and field effect transistors. In one implementation, a method of forming a layer comprising epitaxial silicon comprises epitaxially growing a silicon-comprising layer from an exposed monocrystalline material. The epitaxially grown silicon comprises at least one of carbon, germanium, and oxygen present at a total concentration of no greater than 1 atomic percent. In one implementation, the layer comprises a silicon germanium alloy comprising at least 1 atomic percent germanium, and further comprises at least one of carbon and oxygen at a total concentration of no greater than 1 atomic percent.

In one implementation, a method of forming a layer comprising epitaxial silicon sequentially comprises first exposing a monocrystalline material on a substrate to a silicon-comprising precursor effective to grow a first epitaxial silicon-comprising layer from the monocrystalline material. The first layer is formed to a thickness no greater than 500 Angstroms. Such first exposing is ceased, and the substrate is in-situ annealed while said first exposing is ceased for a period of time. The first layer is then exposed to a silicon-comprising precursor effective to grow a second epitaxial silicon-comprising layer from the first layer, with such being referred to as a second exposing. The second layer is formed to a thickness no greater than 500 Angstroms. Such second exposing is ceased, and the substrate is in-situ annealed while said second exposing is ceased for a period of time. The second layer is then exposed to a silicon-comprising precursor effective to grow a third epitaxial silicon-comprising layer from the second layer.

In one implementation, a method of forming a layer comprising epitaxial silicon comprises exposing a monocrystalline material on a substrate to a silicon-comprising precursor effective to grow a first epitaxial silicon-comprising layer from the monocrystalline material. The first layer is formed to a thickness no greater than 500 Angstroms. The exposing is ceased, and the substrate is in-situ annealed while said exposing is ceased for a period of time. The exposing, ceasing and in-situ annealing are repeated at least twice effective to grow subsequent epitaxial silicon-comprising layers from the first epitaxial silicon-comprising layer.

In one implementation, a method of forming a layer comprising epitaxial silicon comprises first exposing a monocrystalline material on a substrate to a silicon-comprising precursor effective to grow a first epitaxial silicon-comprising layer from the monocrystalline material at a first temperature. The first layer is formed to a thickness no greater than 500 Angstroms. The first exposing is ceased, and the substrate is in-situ annealed while said first exposing is ceased for a period of time. The annealing is conducted at a second temperature which is greater than the first temperature. The first layer is exposed to a silicon-comprising precursor effective to grow a second epitaxial silicon-comprising layer from the first layer.

A field effect transistor comprises a pair of source/drain regions having a channel region received therebetween. A gate is received operably proximate the channel region. The channel region comprises epitaxial silicon. In one implementation, the epitaxial silicon comprises at least one of carbon, germanium, and oxygen present at a total concentration of no greater than 1 atomic percent. In one implementation, the epitaxial silicon comprises an epitaxial silicon germanium alloy comprising at least 1 atomic percent germanium. The silicon germanium alloy comprises at least one of carbon and oxygen present at a total concentration of no greater than 1 atomic percent.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
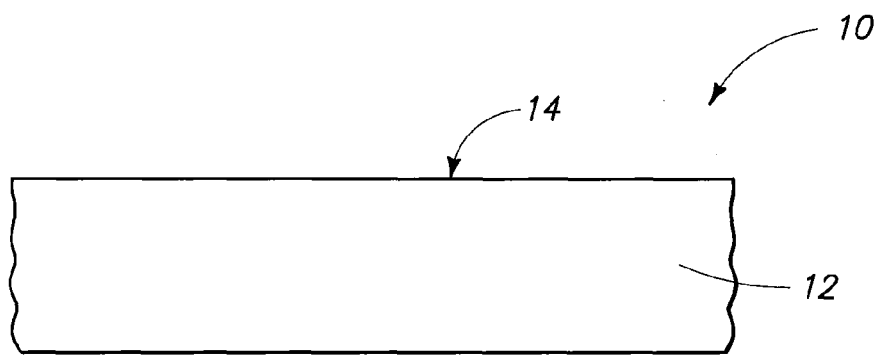
FIG. 1 is a diagrammatic section of a semiconductor wafer fragment in process in accordance with an aspect of the invention.

Exemplary preferred methods of forming a layer comprising epitaxial silicon are initially described with reference to FIGS. 1 and 2. Referring to FIG. 1, a semiconductor substrate in process is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises a material 12 having an outer exposed surface 14. Surface 14 is comprised of monocrystalline material, for example bulk monocrystalline silicon, and for example including an outer surface of epitaxially grown silicon-comprising material, including silicon germanium compositions and/or silicon in combination with other materials. Exposed monocrystalline material 14 might be a blanket exposed surface over the entirety of the substrate being processed or alternately, by way of example only, might be a masked or other partial surface of the substrate.

Figure 2:
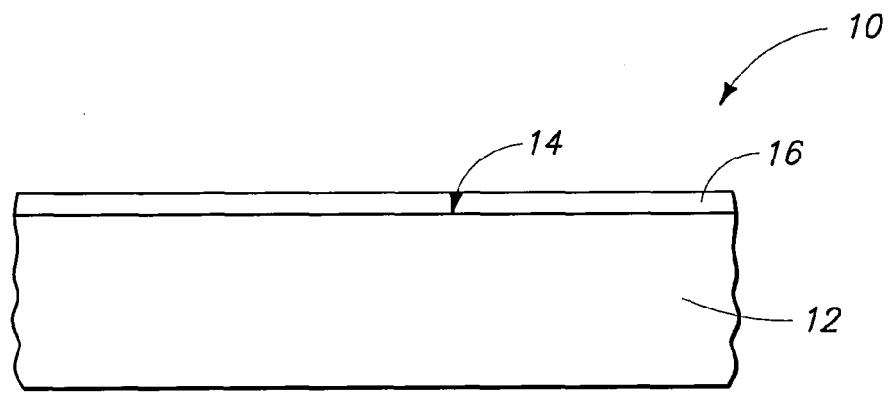
FIG. 2 is a view of the FIG. 1 substrate at a processing step subsequent to that depicted by FIG. 1.

Referring to FIG. 2, a silicon-comprising layer 16 has been epitaxially grown from exposed monocrystalline material 14. In one implementation, epitaxially grown silicon 16 comprises at least one of carbon, germanium and oxygen, with any and all of such being present at a total concentration of no greater than 1 atomic percent. Accordingly, whether one or more of carbon, germanium and oxygen are present, the total concentration of such is no greater than 1 atomic percent in one implementation of the invention. More preferred is a total concentration of no greater than 0.01 atomic percent, and even more preferred at a total concentration of no greater than 0.001 atomic percent. The concentration of pure silicon (including that of silicon germanium alloys having a germanium concentration of at least one percent) is on the order of $1 \times 10^{22}$ atoms/cm$^3$ for solid substrates. An even more preferred total concentration of any one or combination of carbon, germanium and oxygen is much lower than 0.001 atomic percent, for example, in one implementation, being present at a total concentration of from $1 \times 10^{10}$ atoms/cm$^3$ to $1 \times 10^{16}$ atoms/cm$^3$, with an even more preferred specific example being from $1\times10^{14}$ atoms/cm$^3$ to $1\times10^{16}$ atoms/cm$^3$. Other materials might be present in concentrations greater or less than 1 atomic percent, or the layer might consist essentially of (meaning no other material being detectibly present) silicon with at least one of the carbon, germanium and oxygen being present at a total concentration of no greater than 1 atomic percent. More typically, conductivity enhancing impurities will also be provided either during or after formation of the layer.

The epitaxially grown silicon-comprising layer might comprise any one, two or all three of carbon, germanium and oxygen. In one preferred implementation, the epitaxially grown silicon-comprising layer comprises a combination of carbon and germanium, for example in equal or different relative concentrations to one another. When germanium is utilized, a preferred concentration range is from $1\times10^{10}$ atoms/cm$^3$ to $1\times10^{20}$ atoms/cm$^3$, with a specific preferred example being from $1\times10^{10}$ atoms/cm$^3$ to $1\times10^{16}$ atoms/cm$^3$. Further when oxygen is provided, such might be within the layer in SiO$_2$ form. Alternately by way of example only, the oxygen or other(s) of carbon and germanium can exist in silicon as interstitials or small clusters. Oxygen might typically exist as small clusters if provided into the layer within a temperature range of from about 500° C. to 1000° C. and likely also be dependent on concentration of oxygen present in the sample. Where clusters are desired, such can be generated by appropriate heat treatments (i.e., using an anneal at approximately 900° C.) which can tend to pin down dislocations or stacking faults that might otherwise form during cool down. Oxygen clusters also tend to getter mobile impurity ions. Further, oxygen will tend to diffuse out from the surface during post-processing that can facilitate healing of surface defects in the epitaxial layer.

By way of example only, epitaxial growth of a silicon-comprising layer in accordance with aspects of the invention might occur by any existing or yet-to-be developed technique. An exemplary preferred technique includes a temperature range of from 300° C. to 1000° C. and a pressure range of from 10 mTorr to 100 Torr. Exemplary preferred gases for the deposition of epitaxial silicon include dichlorosilane at 0.2 liters/minute, H$_2$ at 20 liters/minute and HCl at 0.15 liters/minute in a single wafer processor having a chamber volume of 8 liters. Where a silicon germanium alloy is desired to be formed at germanium concentrations in excess of one percent or more (described below), GeH$_4$ is an exemplary preferred gas flowed proportionally relative to the volume flow of dichlorosilane to achieve the desired concentration of germanium in an epitaxially grown silicon germanium alloy. Preferred epitaxial silicon growth preferably occurs at a temperature of from 300° to 600° C., and a pressure range of from $10^{-7}$ Torr to $10^{-3}$ Torr.

The at least one of carbon, germanium and oxygen might be provided within layer 16 in a number of manners. One exemplary preferred manner is by ion implantation, for example at the conclusion of the fabrication of layer 16. Yet another preferred manner of providing the at least one of carbon, germanium and oxygen into layer 16 is by exposure to gas. For example and by way of example only, where carbon is provided at a total concentration of no greater than 1 atomic percent, exemplary gases include at least one of CH$_4$, C$_3$H$_8$, C$_2$H$_6$ and CO. Further by way of example, where oxygen is provided at a concentration of no greater than 1 atomic percent, an exemplary exposure gas is H$_2$O. An exemplary exposure gas for germanium is GeH$_4$.

The at least one of carbon, germanium and oxygen might be provided within layer 16 continuously during deposition, or at the conclusion of the deposition of layer 16. Regardless, the at least one of carbon, germanium and oxygen might be provided into the layer at spaced time intervals, and whether provided by ion implantation or by exposure to gas. Further, the exposure to such gas might occur during exposure of the substrate to a silicon-comprising precursor from which the silicon-comprising layer is grown, or alternately such exposure to a gas comprising at least one of carbon, germanium or oxygen might not occur during any exposure to a silicon-comprising precursor from which the epitaxial layer is grown. When providing gas exposure at spaced time intervals, an exemplary preferred time of exposure is anywhere from 1 second to 60 seconds, preferably to facilitate throughput.

In one implementation, layer 16 is fabricated to comprise part of an integrated circuit. The at least one of carbon, germanium and oxygen might be provided homogeneously within the layer in a finished construction of the integrated circuit, or might not be provided homogeneously within the layer in a finished construction of the integrated circuit. Regardless of homogeneity in the finished circuit construction, the most preferred manner of providing the at least one of carbon, germanium and oxygen within layer 16 is at spaced time intervals during the deposition of the epitaxial layer due to the preferred small concentrations desired in the finished construction. If desired, homogeneity might be provided effectively during the deposition by diffusion from the preferred time interval-spaced exposures, or result from annealing subsequent to the formation of layer 16.

Regardless, another preferred deposition technique of providing the at least one of carbon, germanium and oxygen into layer 16 is by atomic layer deposition. Atomic layer depositing (ALD) typically involves formation of successive atomic layers on a substrate. Described in summary, ALD includes exposing an initial substrate to a first chemical species to accomplish chemisorbtion of the species onto the substrate. Theoretically, the chemisorbtion forms a monolayer that is uniformly one atom or molecule thick on the entire exposed initial substrate. In other words, a saturated monolayer is preferably formed. Practically, chemisorbtion might not occur on all portions or completely over the desired substrate surfaces. Nevertheless, such an imperfect monolayer is still considered a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include nitrogen, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. Further, local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

Regardless, in another aspect, the invention contemplates a method of forming a layer comprising epitaxial silicon which comprises epitaxially growing a silicon germanium alloy which comprises at least 1 atomic percent germanium from an exposed monocrystalline material. Preferably, the silicon germanium alloy comprises from 5 atomic percent to 30 atomic percent germanium. In such implementation, the epitaxially grown silicon germanium alloy comprises at least one of carbon and oxygen, with such being present at a total concentration of no greater than 1 atomic percent within the silicon germanium alloy. Accordingly, one or both of carbon and oxygen are preferably provided within a silicon germanium alloy having at least 1 atomic percent germanium. Preferred attributes are otherwise as described above in connection with the first described embodiment, for example with respect to preferred total concentrations, manners of providing one or both of carbon and oxygen in the layer, etc.

Figure 3:
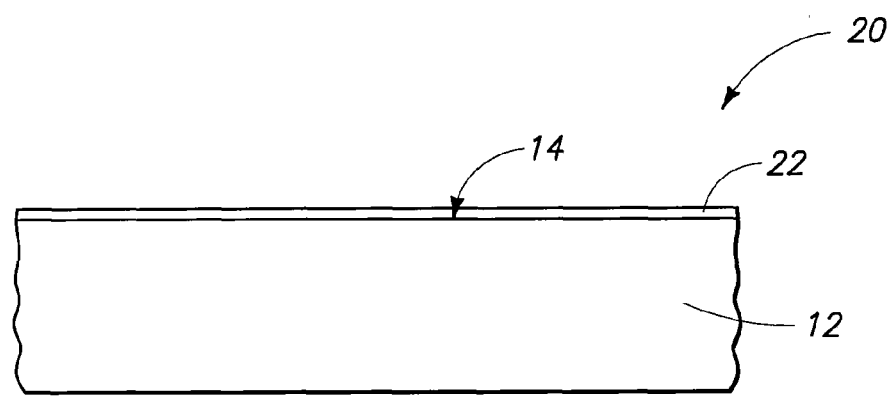
FIG. 3 is a diagrammatic section of another semiconductor wafer fragment in process in accordance with an aspect of the invention.

Aspects of the invention also include additional methods of forming a layer comprising epitaxial silicon independent of and/or including attributes described above. By way of example only, next exemplary preferred additional implementations are described with respect to a substrate fragment 20 in FIGS. 3-5. Referring initially to FIG. 3, such depicts a substrate material 12, like the preferred embodiment substrate material 12 of FIG. 1, having some previously exposed monocrystalline material 14. Monocrystalline material 14 has been first exposed to a suitable silicon-comprising precursor (i.e., any silane) effective to grow a first epitaxial silicon-comprising layer 22 from monocrystalline material 14. In the context of this document, references to "first", "second" and "third" are intended to refer to relative times, not necessarily the first ever, etc., exposure or formation of the stated materials to processing conditions. Such first exposing might include any of the processing described above with, by way of example only, preferred temperature and pressure conditions being as described above and exemplary preferred gases being a combination of dichlorosilane, $H_2$ and HCl. Further by way of example only where the silicon-comprising layer comprises a silicon germanium alloy, an exemplary additional preferred gas for providing the germanium is $GeH_4$. First layer 22 is formed to a thickness no greater than 500 Angstroms, with a more preferred range being from 10 Angstroms to 200 Angstroms, and an even more preferred range being from 20 Angstroms to 50 Angstroms.

In accordance with an aspect of the invention, such first exposing is ceased, and the substrate is in situ annealed while such first exposing has been ceased for a period of time. In the context of this document, in situ requires the annealing to occur within the same chamber within which the immediately preceding exposing occurs. Such ceasing does not necessarily require the complete removal or stopping of flow of the silicon-comprising precursor, but does require either zero or sufficiently low flow to no longer be effective in growing epitaxial silicon-comprising material. Exemplary preferred annealing conditions include a temperature range of from 300° C. to 1000° C., a pressure range of from $10^{-7}$ Torr to 100 Torr, and a period of time of the annealing exposure of from 3 seconds to 60 seconds. In one preferred embodiment, the annealing occurs in an $H_2$-comprising ambient, and further by way of example only, in an ambient consisting essentially of $H_2$. Alternately by way of example only, another preferred embodiment annealing ambient comprises at least one of Ar and He, with a specific preferred ambient consisting essentially of at least one of Ar and He (i.e., consisting essentially of either one or both of Ar and He).

Figure 4:
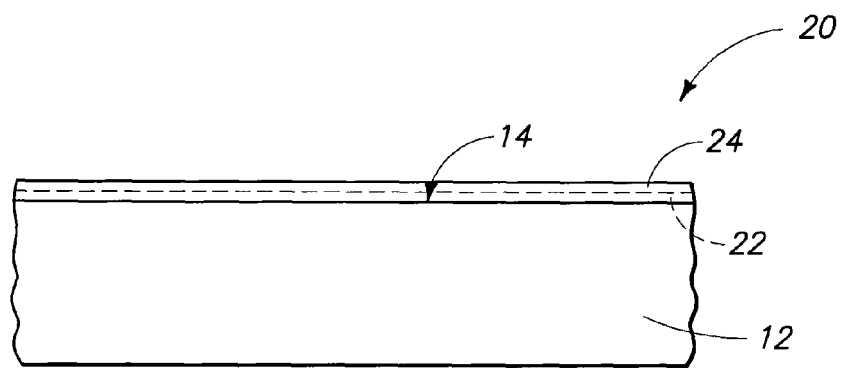
FIG. 4 is a view of the FIG. 3 substrate at a processing step subsequent to that depicted by FIG. 3.

Referring to FIG. 4, first layer 22 has been exposed (referred to as a second exposing) to a silicon-comprising precursor effective to grow a second epitaxial silicon-comprising layer 24 from first layer 22. Second layer 24 is formed to a thickness no greater than 500 Angstroms. First and second layers 22 and 24 might be of the same or different composition, with a same/common composition being most preferred. Further, either or both might comprise additional materials, for example germanium in any concentration. Further, incorporation of at least one of carbon, germanium and oxygen as described in the first embodiment is also contemplated. The preferred thickness ranges for second epitaxial silicon-comprising layer 24 are the same as that of first epitaxial silicon-comprising layer 22. Further, such first and second layers might be formed to the same thickness or to different thicknesses.

In one implementation, the second exposing is ceased, and the substrate is in situ annealed while such second exposing has been ceased for a period of time. Preferred attributes of such ceasing and annealing are as described above with respect to the annealing while the first exposing had been ceased.

The periods of time of exposure to the respective annealings might be of the same quantity or of different quantities, with a preferred range being from 3 seconds to 60 seconds, regardless. Further, all conditions of the first exposing might be the same as all conditions of the second exposing. Alternately, at least one condition of the first and second exposings could be different. In the context of this document, a "condition" refers to any one or more of temperature, pressure, flow rate, time of exposure, and composition of the ambient during exposure. Further and regardless, the annealing while the first exposing is ceased might be conducted at a temperature common with that of the first exposing, or at a temperature not common with that of the first exposing. Likewise, the annealing while the second exposing is ceased might be conducted at a temperature common with that of the second exposing, or not in common with that of the second exposing, and regardless of whether the temperatures of the first and second exposings are the same or different. Accordingly, the respective annealings might be at temperatures the same as, lower than, or greater than the temperatures during the immediate preceding exposing to the silicon-comprising precursor effective to grow the respective epitaxial silicon-comprising layer.

Figure 5:
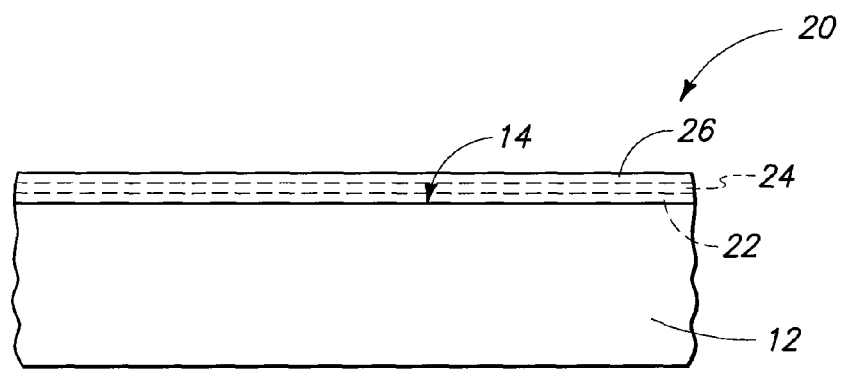
FIG. 5 is a view of the FIG. 4 substrate at a processing step subsequent to that depicted by FIG. 4.

Referring to FIG. 5, second layer 24 has been exposed (herein referred to as the third exposing) to a silicon-comprising precursor effective to grow a third epitaxial silicon-comprising layer 26 from second layer 24. Preferred attributes and methods of forming layer 26 are otherwise as described above with respect to the first and second layers. However in one implementation, third layer 26 might be formed to a thickness no greater than 500 Angstroms, and in another implementation to a thickness at or greater than 500 Angstroms. Further, third layer 26 might be of the same or different in composition from that/those of the first and/or second layers, and formed to the same or different thickness from that/those of the first and/or second layers. Regardless, in one implementation a method is disclosed which cycles between comparative thin layer depositions of an epitaxial silicon-comprising layer followed by in situ anneal treatments. Annealing for at least a few seconds, and preferably in the presence of $H_2$, can improve or increase surface mobility, and reduce or eliminate surface defects and/or dislocations, thereby hopefully precluding propagation of such through growth of the layer. Third epitaxial silicon-comprising layer 26 could, of course, also be annealed subsequent to ceasing the third exposing to a silicon-comprising precursor. In one implementation, third layer 26 might be a final layer for the indicated epitaxial silicon-comprising layer growth, or one or more subsequent epitaxial silicon-comprising layers can be grown (of course, including many more) with or without subsequent annealings.

Regardless, in one implementation an aspect of the invention includes a method of forming a layer comprising epitaxial silicon wherein a monocrystalline material on a substrate is exposed to a silicon-comprising precursor effective to grow a first epitaxial silicon-comprising layer from the monocrystalline material. In such implementation, the first layer is formed to a thickness no greater than 500 Angstroms, and more preferably to a thickness of from 10 Angstroms to 200 Angstroms, and even more preferably, to a thickness of from 20 Angstroms to 50 Angstroms. Otherwise, processing is preferably as described above in connection with the first exposing of the preceding described embodiments.

Such exposing is ceased (for example as described above in connection with the first embodiment), and the substrate is annealed while such exposing has been ceased for a period of time. Otherwise, such annealing is preferably conducted as described above. Then such exposing, ceasing and annealing are repeated at least twice effective to grow subsequent epitaxial silicon-comprising layers from the first epitaxial silicon-comprising layer.

The invention also contemplates a method of forming a layer comprising epitaxial silicon including first exposing a monocrystalline material on a substrate to a silicon-comprising precursor effective to grow a first epitaxial silicon-comprising layer from the monocrystalline material at a first temperature. Exemplary preferred temperatures and other processing parameters and materials are otherwise as described above, for example being between 300° C. and 1000° C. and from 10 mTorr to 100 Torr. The first layer is formed to a thickness no greater than 500 Angstroms.

The first exposing is ceased (as above, meaning at least to the point of being ineffective to grow further silicon-comprising material), and the substrate is annealed while such first exposing is ceased for a period of time. The annealing is conducted at a second temperature which is greater than the first temperature, and preferably at least 50° C. greater. With respect to the annealing, processing is otherwise as described above with respect to the above embodiments.

After such annealing, the first layer is exposed (referred to as a second exposing) to a silicon-comprising precursor effective to grow a second epitaxial silicon-comprising layer from the first layer. Preferred attributes are otherwise as described above with respect to the various exposings, ceasings and annealings. Further by way of example only, the second layer might be formed to a thickness less than, equal to, or greater than 500 Angstroms.

Figure 6:
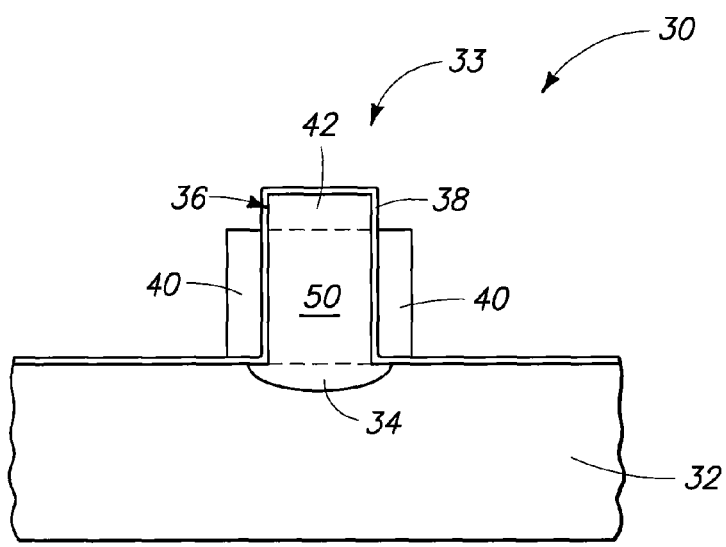
FIG. 6 is a diagrammatic section of an exemplary embodiment field effect transistor in accordance with an aspect of the invention.

Attributes of the invention encompass incorporating any of the above-described epitaxial layers into a component of a field effect transistor. By way of example only, a preferred such component comprises a channel region of a field effect transistor, and further preferably where the field effect transistor is vertically oriented. For example, and by way of example only, FIG. 6 depicts a substrate fragment 30 comprising a substrate 32 and associated vertical field effect transistor 33. Substrate 32 preferably comprises a semiconductor substrate, and for example as depicted, transistor 33 comprises a diffusion region 34 or other region formed within semiconductive material (i.e., monocrystalline silicon, whether bulk, epitaxially grown or otherwise) and which comprises a source/drain region of transistor 33. Substrate fragment 30 comprises a projecting layer 36, for example including one or more of the epitaxial layers formed, and of compositions, as described above. A gate dielectric layer 38 is received over substrate 32 and epitaxial silicon-comprising projection 36. An exemplary preferred material is one or a combination of silicon dioxide and silicon nitride. A transistor gate 40 is received about projection 36. Exemplary preferred materials include one or a combination of conductively doped polysilicon, elemental metals, alloys of elemental metals, and conductive metal compounds. Projection 36 comprises a source/drain region 42 received elevationally outward of gate 40, and a channel region 50 therebetween. Conductivity enhancing doping within regions 34 and 42 would be higher than that of channel region 50, with transistor gate 40 being switchable to control current flow between source/drain regions 34 and 42 through channel region 50. Of course, some or all of the source/drain regions of the transistor might be fabricated to be encompassed by projection 36, with the gate 40 being sized appropriately.

The invention encompasses field effect transistors independent of the method of fabrication, yet includes all the preferred compositional attributes described above with respect to the variously grown epitaxial silicon-comprising layers. In one exemplary implementation, a field effect transistor comprises a pair of source/drain regions having a channel region received therebetween. By way of example only, source/drain regions 34 and 42, and channel region 50, are but one exemplary construction. A gate is received operably proximate the channel region, with gate 40 being but one, exemplary embodiment gate.

The channel region comprises epitaxial silicon. In one implementation, the epitaxial silicon comprises at least one of carbon, germanium and oxygen with such being present at a total concentration of no greater than 1 atomic percent. In one implementation, the epitaxial silicon comprises an epitaxial silicon germanium alloy comprising at least 1 atomic percent germanium, with the silicon germanium alloy comprising at least 1 of carbon and oxygen present at a total concentration of no greater than 1 atomic percent. Preferred compositional aspects and attributes (including methods of fabrication) are otherwise as described above, although the invention contemplates field effect transistors, as just described, independent of the method of fabrication.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. Integrated circuitry comprising:
a semiconductor substrate comprising at least one vertically oriented field effect transistor comprising a pair of source/drain regions having a channel region received therebetween, a first of the source/drain regions being elevationally below the channel region and a second of the source/drain regions being elevationally outward of the channel region, a gate received operably proximate the channel region, the channel region comprising an epitaxial silicon germanium alloy comprising at least 1 atomic percent germanium, the silicon germanium alloy comprising at least one of carbon and oxygen, said at least one being present at a total concentration of no greater than 1 atomic percent.

2. The integrated circuitry of claim 1 wherein said at least one is present at a total concentration of no greater than 0.01 atomic percent.

3. The integrated circuitry of claim 2 wherein said at least one is present at a total concentration of no greater than 0.001 atomic percent.

4. The integrated circuitry of claim 1 wherein said at least one is present at a total concentration of from $1\times10^{10}$ atoms/cm$^3$ to $1\times10^{16}$ atoms/cm$^3$.

5. The integrated circuitry of claim 4 wherein said at least one is present at a total concentration of from $1\times10^{10}$ atoms/cm$^3$ to $1\times10^{14}$ atoms/cm$^3$.

6. The integrated circuitry of claim 1 wherein the silicon germanium alloy comprises from 5 atomic percent to 30 atomic percent germanium.

7. The integrated circuitry of claim 6 wherein said at least one is present at a total concentration of no greater than 0.01 atomic percent.

8. The integrated circuitry of claim 6 wherein said at least one is present at a total concentration of no greater than 0.001 atomic percent.

9. The integrated circuitry of claim 6 wherein said at least one is present at a total concentration of from $1\times10^{10}$ atoms/cm$^3$ to $1\times10^{16}$ atoms/cm$^3$.

10. The integrated circuitry of claim 9 wherein said at least one is present at a total concentration of from $1\times10^{10}$ atoms/cm$^3$ to $1\times10^{14}$ atoms/cm$^3$.

11. The integrated circuitry of claim 1 wherein the semiconductor substrate comprises bulk monocrystalline silicon.

12. The integrated circuitry of claim 1 wherein the at least one comprises carbon and oxygen.

13. The integrated circuitry of claim 1 wherein the at least one comprises only carbon.

14. The integrated circuitry of claim 1 wherein the at least one comprises only oxygen.

15. The integrated circuitry of claim 1 wherein the at least one comprises oxygen.

16. The integrated circuitry of claim 15 wherein the oxygen is provided homogeneously within the channel region.

17. The integrated circuitry of claim 15 wherein the oxygen is not provided homogeneously within the channel region.

18. The method of claim 15 wherein the oxygen is present in the epitaxial silicon as clusters.

19. The method of claim 15 wherein the oxygen is present as $SiO_2$.

20. The method of claim 15 wherein the oxygen is present as interstitials.

21. The integrated circuitry of claim 1 wherein the at least one comprises carbon.

* * * * *